(12) United States Patent
Vampola et al.

(10) Patent No.: US 10,074,786 B2
(45) Date of Patent: Sep. 11, 2018

(54) LED WITH SCATTERING FEATURES IN SUBSTRATE

(71) Applicant: Lumileds LLC, San Jose, CA (US)

(72) Inventors: Kenneth John Vampola, San Jose, CA (US); Hans-Helmut Bechtel, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/689,899

(22) Filed: Aug. 29, 2017

(65) Prior Publication Data
US 2017/0358722 A1    Dec. 14, 2017

Related U.S. Application Data

(63) Continuation of application No. 15/335,354, filed on Oct. 26, 2016, now Pat. No. 9,893,253, which is a
(Continued)

(51) Int. Cl.
*H01L 33/60* (2010.01)
*H01L 33/50* (2010.01)
(Continued)

(52) U.S. Cl.
CPC .............. *H01L 33/60* (2013.01); *H01L 33/02* (2013.01); *H01L 33/36* (2013.01); *H01L 33/501* (2013.01);
(Continued)

(58) Field of Classification Search
CPC ..... H01L 33/60; H01L 33/507; H01L 33/502; H01L 33/501; H01L 33/02; H01L 33/508; H01L 33/36; H01L 2933/0091
See application file for complete search history.

(56) References Cited

U.S. PATENT DOCUMENTS 5,810,463 A * 9/1998 Kawahara ............ G02B 6/0006
                                                  250/227.2
7,411,151 B2 * 8/2008 Sugioka .............. C03C 23/0025
                                                  219/121.68
(Continued)

FOREIGN PATENT DOCUMENTS

DE    102005048408           12/2006
DE    102005048408 A1 * 12/2006    ............. H01L 33/46
(Continued)

OTHER PUBLICATIONS

EPO as ISA, PCT/1814/61196, "International Search Report and Written Opinion", dated Aug. 4, 2014, 15 pages.

*Primary Examiner* — Earl Taylor
(74) *Attorney, Agent, or Firm* — Volpe and Koenig, P.C.

(57) ABSTRACT

In one embodiment, the transparent growth substrate of an LED die is formed to have light scattering areas, such as voids formed by a laser. In another embodiment, the growth substrate is removed and replaced by another substrate that is formed with light scattering areas. In one embodiment, the light scattering areas are formed over the light absorbing areas of the LED die, to reduce the amount of incident light on those absorbing areas, and over the sides of the substrate to reduce light guiding. The replacement substrate may be formed to include reflective particles in selected areas. A 3D structure may be formed by stacking substrate layers containing the reflective areas. The substrate may be a transparent substrate or a phosphor tile that is affixed to the top of the LED.

20 Claims, 4 Drawing Sheets

Related U.S. Application Data continuation of application No. 14/891,344, filed as application No. PCT/IB2014/061196 on May 5, 2014, now Pat. No. 9,508,908.

(60) Provisional application No. 61/823,528, filed on May 15, 2013.

(51) Int. Cl.
*H01L 33/02* (2010.01)
*H01L 33/36* (2010.01)

(52) U.S. Cl.
CPC .......... *H01L 33/502* (2013.01); *H01L 33/507* (2013.01); *H01L 33/508* (2013.01); *H01L 2933/0091* (2013.01)

(56) References Cited

U.S. PATENT DOCUMENTS

| | | | |
|---|---|---|---|
| 7,521,862 B2 | 4/2009 | Mueller et al. | |
| 7,705,870 B2* | 4/2010 | Sato | B23K 26/0643 264/482 |
| 7,786,493 B2 | 8/2010 | Watanabe et al. | |
| 8,013,354 B2* | 9/2011 | Lee | H01L 33/22 257/99 |
| 8,049,239 B2* | 11/2011 | Kim | H01L 33/20 257/436 |
| 8,110,839 B2* | 2/2012 | Ing | G02F 1/133606 257/89 |
| 8,129,611 B2* | 3/2012 | Kobayashi | G02F 1/133504 136/252 |
| 8,177,408 B1* | 5/2012 | Coleman | G02B 3/005 362/615 |
| 8,210,716 B2* | 7/2012 | Lerman | H05K 1/0204 257/88 |
| 8,319,238 B2* | 11/2012 | Lee | H01L 33/20 250/492.2 |
| 8,338,199 B2* | 12/2012 | Lerman | H01L 25/0753 257/59 |
| 8,408,775 B1* | 4/2013 | Coleman | F21V 7/04 362/602 |
| 8,455,895 B2* | 6/2013 | Chai | H01L 25/0753 257/98 |
| 8,742,442 B2* | 6/2014 | Wei | H01L 33/22 257/98 |
| 8,790,997 B2* | 7/2014 | Nakagawa | B23K 26/38 219/121.72 |
| 8,823,029 B2* | 9/2014 | Kim | H01L 33/20 257/436 |
| 9,029,987 B2* | 5/2015 | Nakagawa | B23K 26/38 219/121.72 |
| 9,142,719 B2* | 9/2015 | Wuu | H01L 21/0242 |
| 9,508,908 B2* | 11/2016 | Vampola | H01L 33/02 |
| 9,512,976 B2 | 12/2016 | Bessho et al. | |
| 2005/0110388 A1* | 5/2005 | Takeuchi | G02B 6/0041 313/493 |
| 2005/0141242 A1* | 6/2005 | Takeuchi | G02B 6/0021 362/600 |
| 2005/0169012 A1* | 8/2005 | Takeuchi | G02B 6/0041 362/602 |
| 2009/0244882 A1* | 10/2009 | Samber | H01L 33/507 362/84 |
| 2009/0256167 A1 | 10/2009 | Peeters et al. | |
| 2010/0033078 A1* | 2/2010 | Lee | H01L 27/3246 313/498 |
| 2010/0072488 A1* | 3/2010 | Bierhuizen | H01L 33/505 257/88 |
| 2010/0176415 A1* | 7/2010 | Lee | H01L 33/20 257/98 |
| 2011/0006316 A1* | 1/2011 | Ing | G02F 1/133606 257/89 |
| 2011/0012147 A1 | 1/2011 | Bierhuizen et al. | |
| 2011/0089456 A1* | 4/2011 | Andrews | H01L 33/504 257/98 |
| 2012/0112220 A1* | 5/2012 | West | H01L 33/58 257/98 |
| 2013/0270542 A1* | 10/2013 | Setz | H01L 51/5275 257/40 |
| 2014/0353705 A1* | 12/2014 | Kamikawa | H01L 33/007 257/98 |
| 2015/0014730 A1 | 1/2015 | Mikhailov | |
| 2016/0093782 A1* | 3/2016 | Vampola | H01L 33/02 257/98 |

FOREIGN PATENT DOCUMENTS

| | | | |
|---|---|---|---|
| EP | 1180725 | 2/2002 | |
| EP | 1180725 A2 * | 2/2002 | ............ G03F 7/091 |
| EP | 1387413 | 2/2004 | |
| EP | 1624499 | 2/2006 | |
| EP | 1624499 A2 * | 2/2006 | ............ B82Y 20/00 |
| EP | 1180725 | 8/2006 | |
| EP | 1180725 A3 * | 8/2006 | ............ G03F 7/091 |
| EP | 2192626 | 6/2010 | |
| EP | 2192626 A2 * | 6/2010 | ............ H01L 33/20 |
| JP | 2007-109793 A | 4/2007 | |
| JP | 2008-235469 A | 10/2008 | |
| JP | 2008270689 | 11/2008 | |
| JP | 2008270689 A * | 11/2008 | |
| WO | 2008120165 | 10/2008 | |
| WO | WO 2008120165 A1 * | 10/2008 | ....... B32B 17/10036 |
| WO | 2009155899 | 12/2009 | |
| WO | WO 2009155899 A1 * | 12/2009 | ............ H01L 33/22 |
| WO | 2013124411 | 8/2013 | |
| WO | WO 2013124411 A1 * | 8/2013 | ........... H01L 21/268 |
| WO | 2013154133 | 10/2013 | |
| WO | 2014184701 | 11/2014 | |
| WO | WO 2014184701 A1 * | 11/2014 | ............ H01L 33/02 |

* cited by examiner

LED WITH SCATTERING FEATURES IN SUBSTRATE

CROSS-REFERENCE TO RELATED APPLICATIONS

The present application is a continuation of U.S. patent application Ser. No. 14/891,344 filed on Nov. 14, 2015, titled "LED WITH SCATTERING FEATURES IN SUBSTRATE", which is a § 371 application of International Application No. PCT/IB2014/061196 filed on May 5, 2014, which claims priority to U.S. Provisional Patent Application No. 61/823,528 filed on May 15, 2013. U.S. patent application Ser. No. 14/891,344, International Application No. PCT/M2014/061196, and U.S. Provisional Patent Application No. 61/823,528 are incorporated herein.

FIELD OF THE INVENTION

This invention relates to light emitting diodes (LEDs) and, in particular, to a technique for scattering light within an LED die.

BACKGROUND

In a GaN-based LED emitting blue light, the growth substrate is typically a transparent sapphire substrate, a SiC substrate, or even a GaN substrate. For a flip chip LED, the light is generated by an active layer and exits through the transparent substrate.

FIG. 1 illustrates a conventional GaN-based flip chip LED die 10. The semiconductor layers include an N-type layer 12, an active layer 14 (forming quantum wells), and a P-type layer 16. These layers are grown on a surface of a transparent growth substrate 18, typically sapphire. On top of the substrate 18 is deposited a phosphor layer 20. Phosphor particles 22 are energized by the blue light emitted by the active layer 14 and wavelength shift the light. If the phosphor's emitted color is yellow, the combination of the yellow light and the blue light create white light. Virtually any color light may be created in this manner.

Light extraction efficiency relates to the percentage of generated photons that escape the LED die 10. One goal in designing an LED die is to minimize light absorption so as to increase light extraction efficiency. One contribution to light absorption is total internal reflection (TIR) by the substrate 18, shown by the light ray 24 being trapped inside the substrate 18, where the substrate 18 acts as a light guide. Unmatched indices of refraction at the materials' interfaces give rise to such reflections at shallow angles. As a rough approximation, the index of refraction (n) of GaN is 2.5-3, the index for sapphire is 1.77, the index for phosphor is 1.6-1.8, and the index for air is 1.

Additionally, the LED semiconductor layers, the bottom metal contacts, and the spaces between the contacts have different reflectivities. In the example shown in FIG. 1, the P-metal contacts 26, contacting the exposed P-type layer 16, are silver (Ag) so are highly reflective (>95%). In areas where the P-type layer 16 and active layer 14 are etched away to allow for ohmic contact between the N-metal contacts 28 and the N-type layer 12, a less reflective metal, such as aluminum, is used, and no light is generated over those contact regions. There are also spaces between the contacts 26 and 28 that do not reflect light. There may also be semiconductor features that also absorb light. The emitted phosphor light is generally isotropic, so a significant percentage of such light impinges on light absorbing areas of the LED die 10, such as light ray 30. Another light ray 32 is shown being internally reflected off the side of the substrate 18 and back into the LED die 10 to be partially absorbed. A light ray 33 is shown being efficiently reflected by the P-metal contact 26.

All the absorbing areas reduce the light extraction efficiency of the LED die.

What is needed is a technique for increasing the light extraction efficiency by reducing the absorption of light within an LED die.

SUMMARY

In one embodiment, the transparent growth substrate of an LED die is formed to have light scattering areas, such as voids formed using a laser or other method. In another embodiment, the growth substrate is removed and replaced by another transparent substrate that contains light scattering areas. In one embodiment, the light scattering areas are formed over some or all of the light absorbing areas of the LED die that do not generate light, to reduce the amount of incident light on those absorbing areas, and over the sides of the substrate to reduce light guiding.

If the substrate replaces the growth substrate, the substrate may be formed to include reflective particles, such as $TiO_2$ particles or reflective metal flakes, in selected areas. A 3D structure may be formed by stacking substrate layers containing the reflective areas.

In another embodiment, the substrate is a non-transparent phosphor layer formed to have light scattering sidewalls.

The phosphor layer may be a tile that is affixed to the top of the LED, or may be deposited as particles in a liquid binder, or may be deposited by electrophoresis, or deposited by other methods.

Other embodiments are described.

BRIEF DESCRIPTION OF THE DRAWINGS

Elements that are the same or similar are labeled with the same numeral.

DETAILED DESCRIPTION

Figure 1:
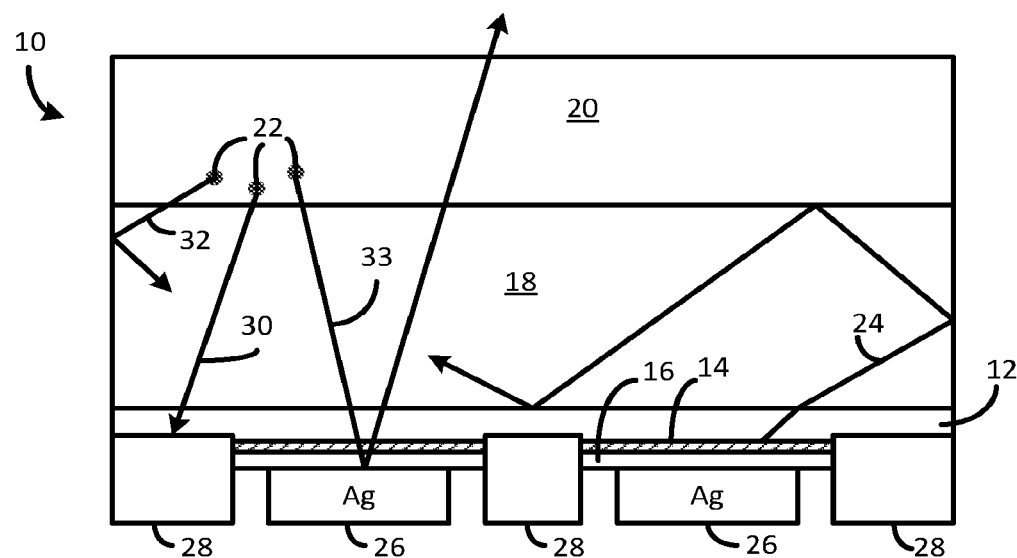
FIG. 1 is a cross-sectional view of an LED die showing various ways in which light rays are absorbed by the LED die.
Figure 2:
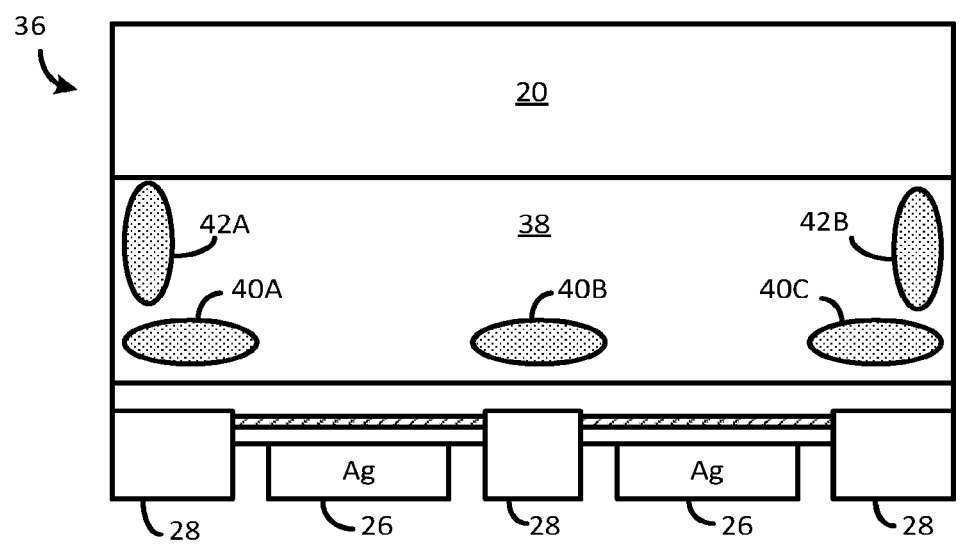
FIG. 2 is a cross-sectional view of an LED die incorporating a substrate containing light scattering areas, in accordance with one embodiment of the invention.

FIG. 2 illustrates an LED 36 that may be the same as the LED die 10 in FIG. 1 except for the substrate 38. The substrate 38 may be the growth substrate on which the LED semiconductors have been epitaxially grown or may be a substrate that has been affixed to the LED semiconductor layers after the growth substrate has been removed.

The substrate 38 is formed to have light scattering areas 40A, 40B, and 40C over some or all of the light absorbing areas and to have light scattering areas 42A and 42B over some or all of the sidewalls to reduce light guiding within the substrate 38. The scattering areas 42A and 42B may be part of a continuous scattering area ring around the sidewalls.

In one embodiment, the substrate 38 is a sapphire growth substrate on which the LED semiconductor layers have been epitaxially grown. The scattering areas 40A-40C, 42A, and 42B may be formed as an array of voids before or after the semiconductor layers are grown. The scattering areas 40A-40C, 42A, and 42B may have any 3D shape, such as a polyhedron or rounded. A pulsed laser may be used to create the voids. The use of pulsed lasers to write or create images using dots (voids) within transparent materials is well known; however, this technique has not been used for scattering light in an LED die.

In another embodiment, the growth substrate is removed, such as by laser lift-off, after the semiconductor layers have been grown, and another substrate is affixed to the semiconductor layers, such as to the N-type layer 12. Such substrates may be, for example, glass, sapphire, SiC, plastic, epoxy, or ceramic. The substrate 38 may be affixed to the LED semiconductor layers by any suitable adhesive, such as epoxy or silicone, or by fusing the substrate material directly to the LED semiconductor layers. For the affixed substrates, the scattering areas 40A-40C, 42A, and 42B may be formed as voids or light scattering particles. The substrate 38 may undergo a pulsed laser treatment to form the voids or may be molded to include the light scattering particles in the selected areas. For molding, a large substrate wafer mold may be provided and the reflective particles may be infused in selected areas using a screen printing process or other process while the substrate material is in liquid form. The molded substrate is then cured and affixed to the LED wafer after the growth substrate has been removed. Other ways of forming the substrate 38 are envisioned, such as stacking layers (shown in FIG. 9) or using 3D printing methods. The affixed substrate then provides mechanical support for the remainder of the LED fabrication process. The LED wafer is then singulated.

The reflective particles may be, for example, $TiO_2$ flakes or reflective metal flakes, such as Ag flakes. In one embodiment, the flakes may range between 0.1-10 microns wide. Since the flakes are intended to scatter light, the reflective surfaces of the flakes may be at random angles. A typical width of an LED die is on the order of 1 mm.

In the example of FIG. 2, the scattering areas 40A, 40B, and 40C are formed generally over the inactive portions of the LED die, where light is not generated. Therefore, the scattering areas 40A-40C do not block any light emitted upwards. The scattering areas 40A-40C are also preferably formed over areas that are poor reflecting surfaces, such as between metal contacts 26 and 28 or over the N-metal contacts 28. Light that passes between the contacts 26 and 28 would have to be reflected upwards by any underlying submount or printed circuit board, which are typically poor reflectors. Preferably, there are no scattering areas over the highly reflective silver contacts 26, used for contacting the P-type layer 16.

The shape of each scattering area 40A-40C would be tailored for the particular underlying area to be blocked. The shapes may be rectangular, circular, etc. The thickness of each scattering area 40A-40C depends on the structure of the scattering area 40A-40C. For example, if the scattering area 40A-40C contains reflective flakes, and only a very thin layer of the flakes is needed to adequately block light from impinging on the underlying area, then only a thin layer is required. The layer may be as thin as 10 microns, but will typically be around 50 microns thick.

In one embodiment, the substrate 38 is approximately 75-300 microns thick. Therefore, the scattering areas 40A-40C near the bottom of the substrate 38 may be 25-250 microns away from the phosphor layer 20.

In FIG. 2 and some other figures, the phosphor layer 20 is shown only over the top of the LED die. However, the phosphor layer may also cover the sidewalls of the substrate 38 and semiconductor layers in all the embodiments.

Figure 3:
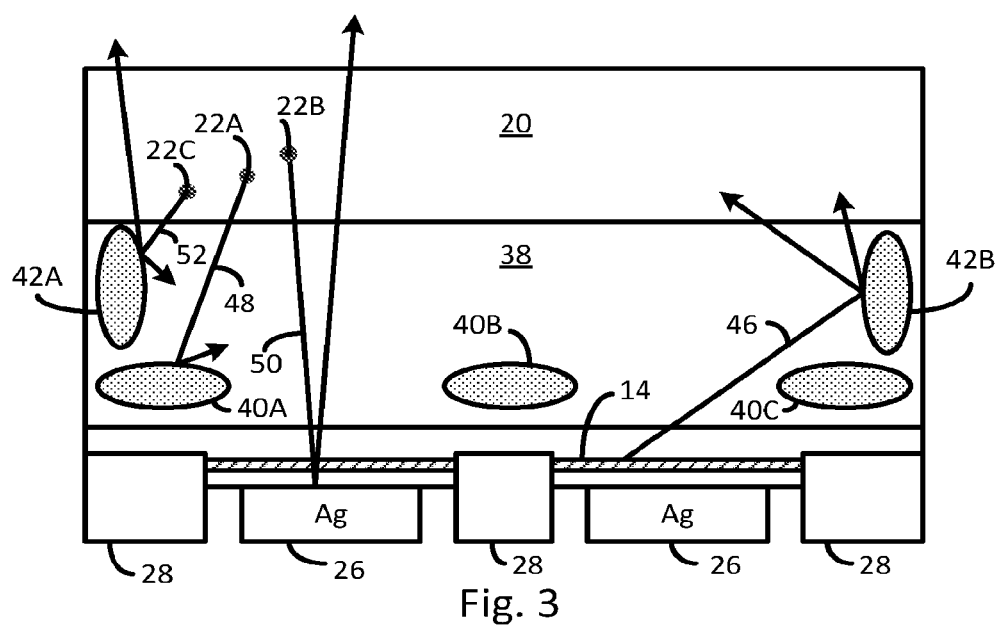
FIG. 3 illustrates how light rays in the structure of FIG. 2 are redirected away from the light absorbing areas of the LED die and away from the sides of the substrate.

FIG. 3 illustrates various light rays generated by the active layer 14 and the phosphor particles 22 that impinge on a scattering area. Light ray 46 is generated by the active layer 14 and is scattered by the scattering area 42B in various directions rather than at the incident angle so that the substrate 38 will be a very poor light guide (i.e., light will escape after only a few reflections).

Light ray 48 is emitted from a phosphor particle 22A and is redirected away from a light absorbing area by scattering area 40A. Light ray 50 is emitted by a phosphor particle 22B and is reflected off the P-metal contact 26. Light ray 52 is emitted by a phosphor particle 22C and is redirected both upward and downward by multiple reflecting surfaces in the scattering area 42A.

Figure 4:
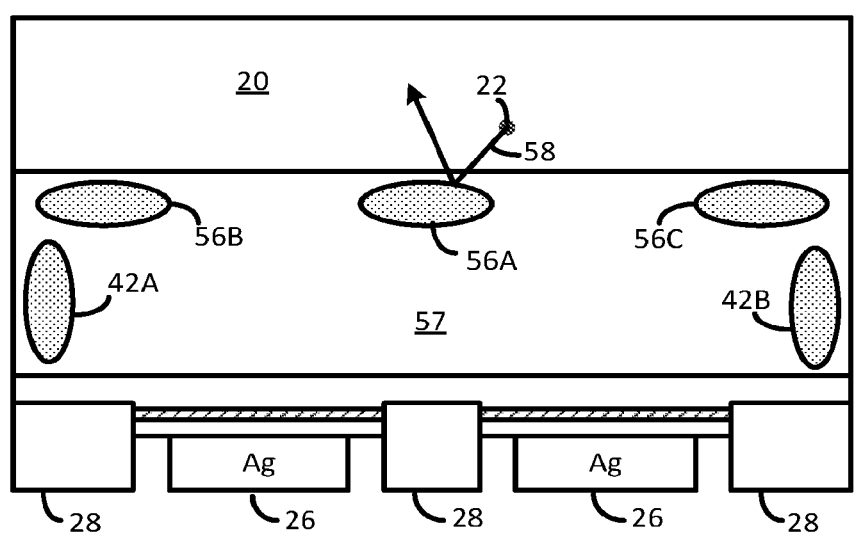
FIG. 4 is a cross-sectional view of an LED die showing an alternative pattern of light scattering areas in the substrate.

FIG. 4 illustrates that scattering areas 56A-56C may be formed near the top of the substrate 57 overlying the absorbing areas of the LED die or overlying the non-light-generating areas of the LED die. A light ray 58 is shown reflected off the scattering area 56A, avoiding any absorption by the semiconductor layers or the underlying layers.

Figure 5:
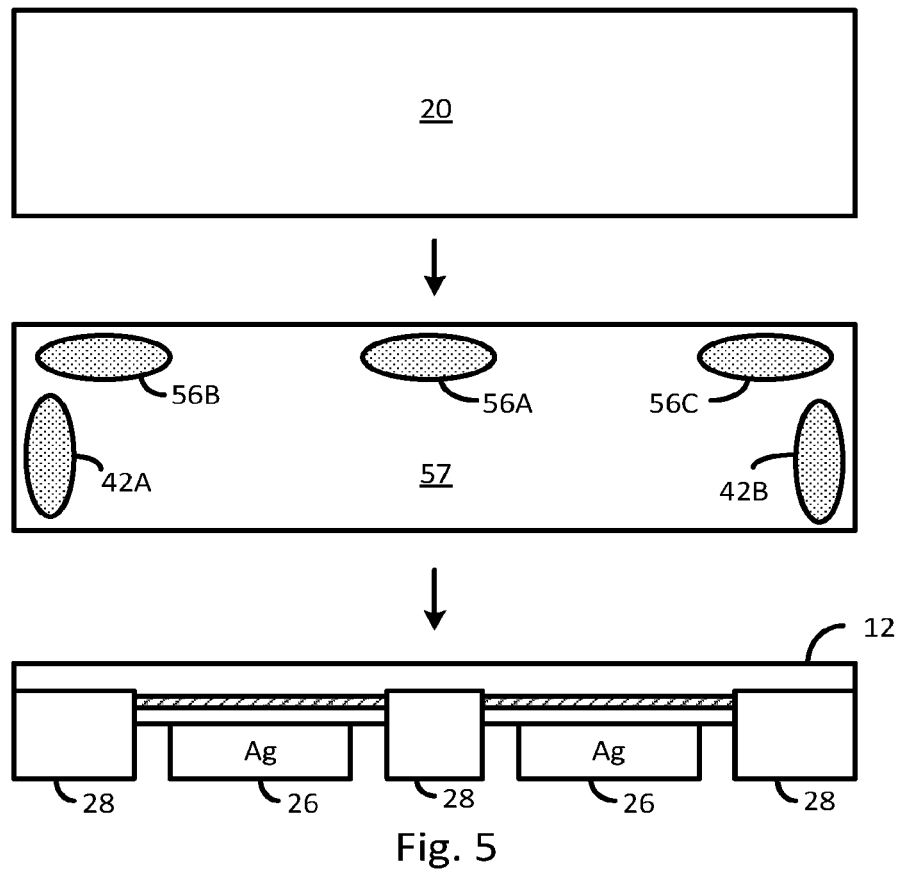
FIG. 5 illustrates how a substrate with scattering areas may be affixed to the LED semiconductor layers.

FIG. 5 illustrates how the LED structure of FIG. 4 may be formed. After the LED semiconductor layers are grown, the growth substrate is removed, and the substrate 57 is affixed to the top of the N-type layer 12. A thin layer of silicone may be used as the adhesive. The affixing may be performed under heat and pressure in a vacuum environment. Alternatively, the substrate 57 is softened and fuses directly to the N-type layer 12. The N-type layer 12 may first be roughened for increasing light extraction and for aiding in the adhesion.

In one embodiment, the scattering areas 42A, 42B, and 56A-56C are molded into the substrate when the substrate wafer is formed.

A phosphor layer 20 is then formed over the substrate 57. The phosphor layer 20 may also be formed over the sides of the substrate 57 and the LED layers. In one embodiment, the phosphor layer 20 is a tile affixed to the substrate 57 with a thin layer of silicone. The phosphor layer 20 may also be deposited as a liquid and cured, or deposited by electrophoresis.

Figure 6:
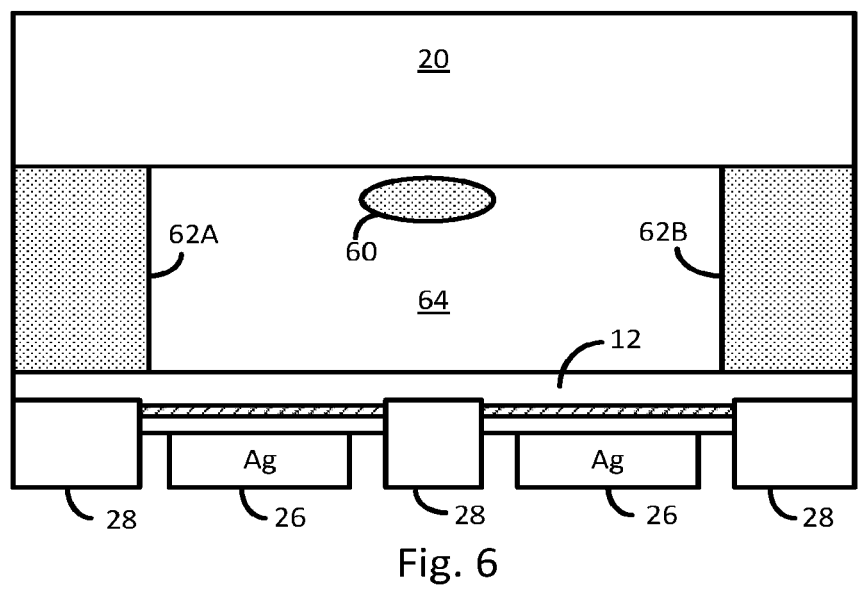
FIG. 6 illustrates how the substrate may be formed with light scattering sidewalls.

FIG. 6 illustrates another embodiment with a central scattering area 60 and scattering areas 62A and 62B forming sidewalls of the substrate 64. Scattering areas 62A and 62B may be part of a continuous scattering area ring along the sidewalls. The scattering areas may be positioned anywhere to achieve a desired emission pattern, irrespective of the use of the scattering areas to reduce light absorption. Achieving a certain emission pattern is particularly important when the LED image is magnified, such as by a parabolic mirror or a projector. If the scattering from the scattering areas 62A and 62B is large, this embodiment should increase the amount of light that exits through the phosphor layer 20. This improves the color uniformity over the surface of the device.

The central scattering area 60 may be eliminated, and the scattering areas 62A and 62B limit any side emission from the LED die and enhance the front emission.

Figure 7:
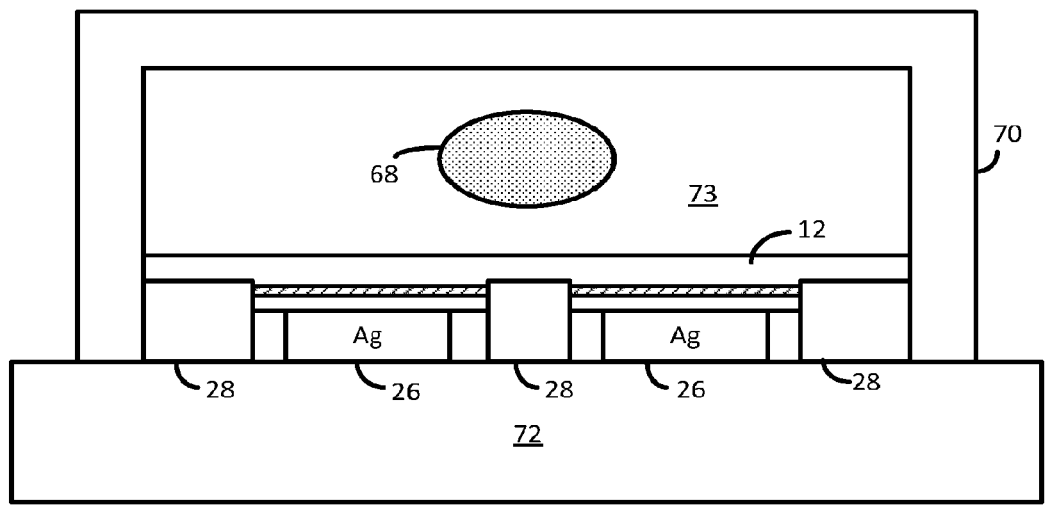
FIG. 7 illustrates a substrate with a central light scattering area for creating a batwing light emission pattern.

FIG. 7 illustrates another shape of a scattering area 68 for forming a batwing emission pattern. The scattering area 68 may form a central square or circle when viewed from the top down to provide the desired emission pattern. In one embodiment, the diameter of the scattering area 68 is about 300 microns. The phosphor layer 70 is shown as a conformal layer extending over the sides of the device and down to a submount 72 or printed circuit board surface. The substrate 73 may also have scattering areas forming any portion of its sidewalls.

Figure 8:
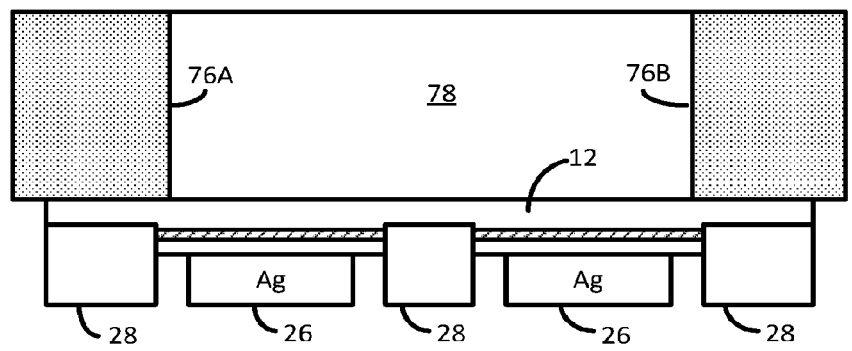
FIG. 8 illustrates a phosphor tile affixed on the LED semiconductor layers, where the tile has light scattering sidewalls.

FIG. 8 illustrates sidewall scattering areas 76A and 76B formed in a phosphor tile 78. Scattering areas 76A and 76B may be part of a continuous scattering area ring along the sidewalls. In FIG. 8, there is no transparent substrate used, and the growth substrate has been removed. The phosphor tile 78 may be phosphor powder infused in a silicone binder that is pre-formed prior to being affixed to the semiconductor layers. Reflective flakes may be screen printed into a mold when forming a phosphor wafer. The phosphor wafer may then be affixed to the top of an LED wafer with a thin (<10 microns) layer of silicone, where the resulting wafer is ultimately singulated. The scattering areas 76A and 76B limit any side emission. In this structure, the phosphor tile 78 also serves as a substrate. This structure may be particularly suited to automobile headlights and projectors.

Figure 9:
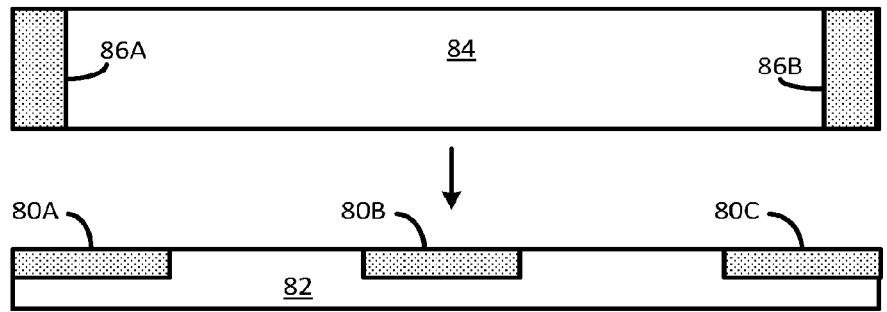
FIG. 9 illustrates how a substrate may be formed using multiple layers to create the desired light scattering areas.

FIG. 9 illustrates how a 3D substrate may be formed, where the scattering areas 80A-80C are formed in the top surface of a first substrate layer 82, such as by screen printing or using a mold, followed by lamination to a second substrate layer 84 under heat and pressure. The second substrate layer 84 is shown having additional scattering areas 86A and 86B forming its sidewalls. Any 3D pattern of scattering areas may be formed by stacking layers of the substrate material. In this way, a scattering area may be formed inside a substrate.

In general, the scattering areas are not positioned at places where they would be detrimental to performance, unless the scattering areas were used to shape the light emission. Simulations may be performed to determine the optimal areas and scattering area shapes to maximize light extraction efficiency. Places that are typically highly absorbing and that do not generate light include the edges of the LED semiconductor layers. In one embodiment, a scattering area is formed as a single ring near the bottom of the substrate overlying the edge of the semiconductor layers where no light is generated.

In some applications, the substrate surface is textured to additionally scatter light and/or to improve light extraction. The present invention differs from such surface texturing in that embodiments of the invention introduce either reflective particles or reflective voids within the substrate (not just on a surface) to scatter light.

In one embodiment, an affixed substrate is formed with a bulk material that inherently scatters some light, such as a substrate that is uniformly infused with light diffusing particles (e.g., $TiO_2$). The light scattering areas of the present invention would enhance the scattering over certain areas by modifying the substrate's bulk material.

In certain applications of LEDs, the LED die is located in a system with other LED dies or in a reflective chamber. In such a case, externally generated light impinges on the LED die. The present invention may also be used to reduce light absorption by the LED die where the light is generated externally. Accordingly, the system efficiency is improved.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light-emitting device, comprising:
   a light-emitting structure, the light-emitting structure including a plurality of semiconductor layers, one or more first contacts, and one or more second contacts that have a higher light reflectance than the first contacts; and
   a substrate coupled to the light-emitting structure, the substrate including one or more light-scattering structures that are horizontally aligned with the first contacts and horizontally offset from the second contacts to permit at least some of light that is reflected off the second contacts to travel past the light-scattering structures.

2. The light-emitting device of claim 1, wherein the first contacts are formed of a different material than the second contacts.

3. The light-emitting device of claim 1, wherein a respective central portion of each of the light-scattering structures is disposed above a different one of the first contacts.

4. The light-emitting device of claim 1, wherein each of the light-scattering structures includes a void that is formed in the substrate.

5. The light-emitting device of claim 1, further comprising a wavelength-converting structure coupled to the substrate, wherein the one or more light-scattering structures are arranged to prevent at least some of light emitted from the wavelength-converting structure towards the first contacts from reaching the first contacts, while allowing at least some of light emitted from the wavelength converting structure towards the second contacts to reach the second contacts.

6. The light-emitting device of claim 1, further comprising a wavelength-converting structure coupled to the substrate, wherein the one or more light-scattering structures are arranged to prevent at least some of light emitted from the wavelength-converting structure towards one or more sidewalls of the light-emitting device from reaching the sidewalls.

7. The light-emitting device of claim 1, wherein the light scattering structures are located outside of portions of the substrate that are situated over the second contacts.

8. A light-emitting device comprising:
   a light-emitting structure, the light-emitting structure including a plurality of semiconductor layers, one or more first contacts, and one or more second contacts; and
   a pre-formed tile of wavelength-converting material coupled to a first surface of the light-emitting structure, the tile including one or more first light-scattering structures that are arranged on a periphery of the tile, each first light-scattering structure including a void that is formed in the tile.

9. The light-emitting device of claim 8, wherein the wavelength-converting material includes a phosphor suspended in a binder.

10. The light-emitting device of claim 8, wherein the first light-scattering structures are arranged on a periphery of the tile to form a scattering area along each of a plurality of sidewalls of the tile that surrounds a central area of the tile.

11. The light-emitting device of claim 8, wherein the first contacts are formed of a different material than the second contacts.

12. The light-emitting device of claim 11, wherein the first contacts have a lower light reflectance than the second contacts.

13. The light-emitting device of claim 11, further comprising a substrate disposed between the light-emitting structure and the pre-formed tile, the substrate including one or more second light-scattering structures that are aligned with the first contacts and horizontally offset from the second contacts to permit at least some of light that is reflected off the second contacts to travel past the light-scattering structures, wherein the one or more second light-scattering structures are arranged to prevent at least some of light emitted from the tile of wavelength-converting material towards the first contacts from reaching the first contacts, while allowing at least some of light emitted from the tile of wavelength-converting material towards the second contacts to reach the second contacts.

14. The light-emitting device of claim 11, further comprising a substrate disposed between the light-emitting structure and the pre-formed tile, the substrate including one or more second light-scattering structures that are aligned with the first contacts and horizontally offset from the second contacts to permit at least some of light that is reflected off the second contacts to travel past the light-scattering structures, wherein the one or more second light-scattering structures are arranged to prevent at least some of light emitted from the tile of wavelength-converting material towards one or more sidewalls of the light-emitting device from reaching the sidewalls.

15. A light-emitting device, comprising:
a light-emitting structure, the light-emitting structure including a plurality of semiconductor layers, one or more first contacts, and one or more second contacts, the second contacts having a greater reflectance than the first contacts; and
a substrate coupled to a first surface of the light-emitting structure, the substrate having a plurality of sidewalls, the substrate including one or more first light-scattering structures that are formed in the substrate, the light scattering structures being located outside of portions of the substrate that are situated over the second contacts.

16. The light-emitting device of claim 15, wherein the substrate further includes at least one second light-scattering structure that is formed in a central portion of the substrate.

17. The light-emitting device of claim 15, wherein each of the first light-scattering structures includes a void that is formed in the first light-scattering structure.

18. The light-emitting device of claim 15, further comprising a pre-formed tile of wavelength-converting material coupled to the substrate, the tile including one or more second light-scattering structures that are arranged on a periphery of the tile, each second light-scattering structure including a void that is formed in the tile.

19. The light-emitting device of claim 18, wherein the second light-scattering structures are arranged on a periphery of the tile to form a scattering area along a plurality of sidewalls of the tile that surrounds a central area of the tile.

20. The light-emitting device of claim 15, wherein one or more light-scattering structures that are horizontally aligned with the first contacts and horizontally offset from the second contacts to permit at least some of light that is reflected off the second contacts to travel past the light-scattering structures.

* * * * *